United States Patent [19]

Morton et al.

[11] 4,455,493

[45] Jun. 19, 1984

[54] SUBSTRATE BIAS PUMP

[75] Inventors: Bruce L. Morton, Round Rock; Jerry D. Moench, Austin, both of Tex.

[73] Assignee: Motorola, Inc., Schaumburg, Ill.

[21] Appl. No.: 394,030

[22] Filed: Jun. 30, 1982

[51] Int. Cl.³ .................... H01L 29/78; H03K 17/16; H03K 17/693

[52] U.S. Cl. ................................ 307/296 R; 307/304

[58] Field of Search .................... 307/296 R, 297, 304

[56] References Cited

U.S. PATENT DOCUMENTS 4,307,333 12/1981 Hargrove ........................ 307/304 X 4,384,218 5/1983 Shimotori et al. .............. 307/297 X

*Primary Examiner*—Stanley D. Miller

*Assistant Examiner*—David R. Hudspeth

*Attorney, Agent, or Firm*—James L. Clingan, Jr.

[57] ABSTRACT

A substrate bias pump is provided with a signal controlled circuit for coupling a negatively charged pump node to a substrate with a negligible voltage loss therebetween. A transistor, connected as a capacitor, with a source and a drain connected together for receiving a pump signal, and a gate connected to the pump node, avoids adding parasitic capacitance to the pump node.

6 Claims, 3 Drawing Figures

- PRIOR ART -

SUBSTRATE BIAS PUMP

FIELD OF THE INVENTION

This invention relates to substrate bias pumps, and more particularly, to substrate bias pumps which avoid passing current through PN junctions to charge the substrate.

BACKGROUND OF THE INVENTION

Substrate bias pumps comprise an oscillating signal capacitively coupled at a pump node to a clamping means to level shift the signal downward and substrate coupling means for coupling the negative portion of the level shift signal to the substrate. Using conventional PN junction diodes for clamping the signal and coupling to the substrate is a problem for high density dynamic RAMs because of the energetic electrons which are thereby injected into the substrate and cause errors in the capacitive storage elements. In order to prevent such errors, diode-connected insulated gate field effect transistors (IGFETs) are used to bypass PN junctions because IGFETs can have a lower threshold voltage, for example 0.4 volt, than the PN junction voltage of 0.6 to 0.7 volt. This difference in voltage between the threshold voltage of an IGFET and a PN junction voltage drop also produces an increase in efficiency of the pump. The voltage drop of the clamp is reduced as is the voltage drop of the substrate coupling means. There may be cases, however, where transistors with a threshold voltage below 0.6 volt are not conveniently available. In any event, efficiency has been further improved by further reducing the voltage drop of the clamping circuit by a circuit shown in FIG. 1. There remains, however, the inefficiency of the voltage drop of the substrate coupling means as well as the possibility of electron injection for threshold voltages over 0.6 volt. In addition, there is also an inefficiency with a typical coupling capacitor. The typical capacitor is an IGFET with a gate as one electrode and a source and drain connected together as a second electrode at the pump node. The signal applied to the first electrode is reduced at the pump node by virtue of the parasitic capacitance of the source and drain to the substrate.

SUMMARY OF THE INVENTION

An object of the present invention is to provide an improved substrate bias pump.

Another object of the invention is to provide a substrate coupling means with a reduced voltage drop.

Yet another object of the invention is to provide a coupling capacitor with reduced parasitic capacitance at the pump node.

Even yet another object of the invention is to provide a substrate bias pump which uses IGFETs with a threshold voltage in excess of a PN junction voltage but which avoided electron injection into the substrate via a PN junction.

These and other objects are achieved in accordance with the invention by providing a substrate bias pump for charging a substrate comprising: a coupling capacitor for coupling a pump signal to a pump node; clamping means for preventing the pump node from exceeding a predetermined voltage when the pump signal is at a first level; and coupling means for coupling the pump node to the substrate in response to a coupling signal.

The coupling capacitor can be a depletion transistor having a negative threshold voltage which is of a magnitude greater than the voltage swing of the pump signal and having first and second current electrodes for receiving the charging signal, and a control electrode coupled to the charge node.

DESCRIPTION OF A PREFERRED EMBODIMENT

Figure 1:
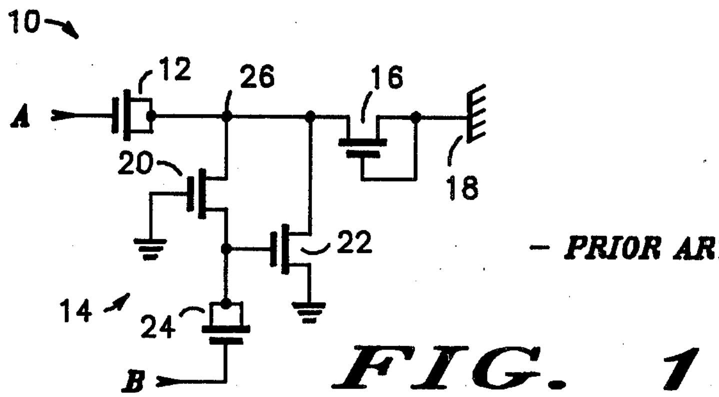
FIG. 1 is a schematic diagram of a substrate bias pump of the prior art.

Shown in FIG. 1 is a substrate bias pump 10 of the prior art comprised generally of a transistor 12 connected as a capacitor, a clamp circuit 14, a transistor 16, and a substrate 18 of P material. The transistors as shown are N-channel IGFETs of the enhancement type with a threshold voltage of 0.3 to 0.4 volt and sources and drains of N+ material. Clamp circuit 14 comprises a transistor 20, a transistor 22, and a transistor 24 connected as a capacitor. Transistor 12 has a gate for receiving a pump signal A and a source and a drain connected to a pump node 26. Transistor 16 has a source connected to node 26 and a gate and a drain connected to substrate 18. Transistor 20 has a drain connected to node 26, a gate connected to ground, and a source. Transistor 22 has a drain connected to node 26, a gate connected to the source of transistor 20, and a source connected to ground. Transistor 24 has a gate for receiving a clamping signal B, and a source and a drain connected to the gate of transistor 22.

Figure 3:
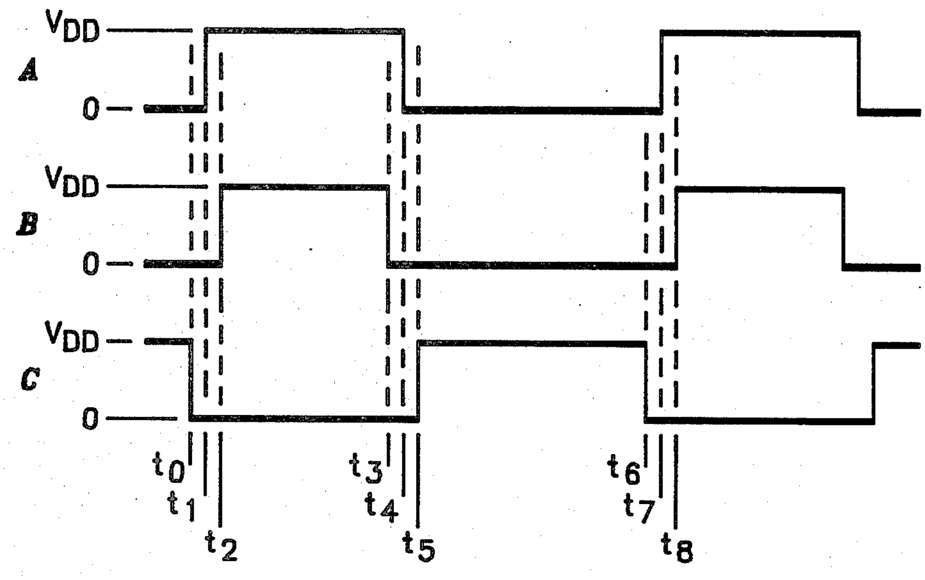
FIG. 3 is a timing diagram of signals useful in implementing the substrate bias pumps of FIGS. 1 and 2.

Signal A, shown in FIG. 3, oscillates between a power supply voltage $V_{DD}$, typically 5 volts, and ground. When signal A is at $V_{DD}$, node 26 is held at essentially ground by clamping circuit 14 in response to signal B which, as shown in FIG. 3, also oscillates between $V_{DD}$ and ground. Signal B is coupled by transistor 24 to the gate of transistor 22 thereby enabling transistor 22 and clamping node 26 to ground. When signal A makes a transition to ground, node 26 goes negative. Transistor 16 then couples node 26 to substrate 18 drawing current from substrate 18 to node 26. This current simultaneously drives the voltage on substrate 18 to a more negative voltage driving the voltage on node 26 less negative. Transistor 16, in the conventional diode connection, causes a threshold voltage drop between substrate 18 and node 26. Consequently, the substrate voltage can be no more negative than one threshold voltage above the most negative voltage at node 26. The amount of charge than can be drawn from substrate 18 by virtue of transistor 12 is equal to the voltage across transistor 12 less the magnitude of the substrate voltage (assuming the substrate voltage is negative) multiplied by the capacitance of transistor 12. Therefore, with each negative transition of signal A, transistor 16 prevents an amount of charge equal to one threshold voltage multiplied by the capacitance of transistor 12 from being drawn from substrate 18. Consequently, transistor 16 not only limits how negative the substrate voltage can be, but also reduces the potential rate with which charge can be drawn from substrate 18.

After signal A switches to $V_{DD}$, node 26 is held at essentially ground by transistor 22 in response to signal B. After signal A switches to $V_{DD}$ at time $t_1$, as shown in FIG. 3, signal B switches to $V_{DD}$ at time $t_2$ turning transistor 22 on sufficiently hard so that it has only a negligible drain to source voltage drop. At time $t_3$, when signal B switches to ground, transistor 22 will be turned off. Subsequently, at time $t_4$, signal A switches to ground which brings node 26 to a negative voltage. As the node 26 voltage goes negative, transistor 20 turns on, coupling the gate of transistor 22 to node 26 thereby preventing transistor 22 from turning on. From time $t_7$, when signal A next goes to $V_{DD}$, until time $t_8$, transistor 20, due to the bidirectional characteristic of an IGFET, couples the gate of transistor 22 to node 26 as node 26 raises in voltage to ensure that transistor 22 will turn on when signal B subsequently goes to $V_{DD}$ at time $t_8$. The capacitance of transistor 24 is made very small relative to the capacitance of transistor 12.

Figure 2:
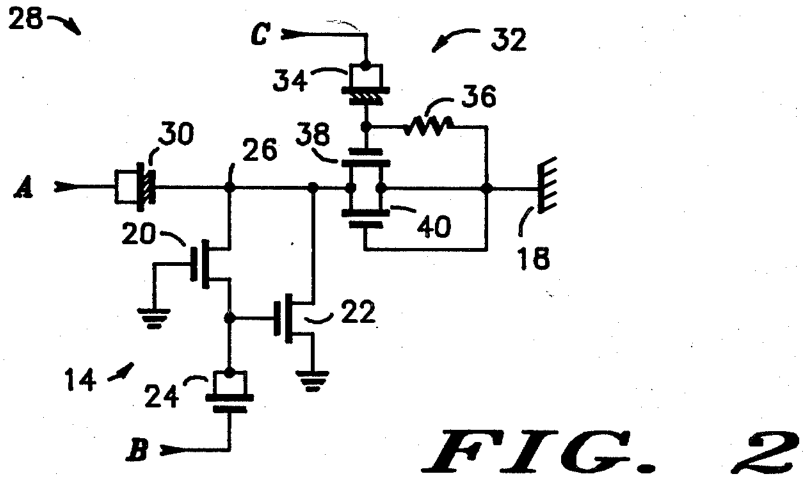
FIG. 2 is a schematic diagram of a substrate bias pump according to a preferred embodiment of the present invention.

Shown in FIG. 2 is a substrate bias pump 28 which provides an improvement over substrate bias pump 10 by providing a depletion transistor 30 connected as a capacitor coupled to node 26 in place of transistor 12, and a coupling circuit 32 between node 26 and substrate 18 in place of transistor 16. Clamping circuit 14 is connected the same and operates the same for both substrate bias pumps 10 and 28. Depletion transistor 30 has a threshold voltage of −11 to −13 volt and has a source and a drain connected together to receive signal A and a gate connected to node 26. With the gate of transistor 30 connected to node 26 the parasitic capacitance associated with the source and drain is driven by signal A instead of dividing the signal strength at node 26. The additional loading of this parasitic capacitance to signal A is negligible. Consequently the voltage across transistor 30 is increased over the voltage across transistor 12 of FIG. 1 which allows substrate 18 to go more negative as well as improving the rate at which charge can be drawn from substrate 18.

The capacitance from gate to source-drain of an IGFET transistor, whether enhancement such as transistor 12 or depletion such as transistor 30, is at one of two levels with the transition between the two levels occurring over a several volt range at the threshold voltage of the transistor. A relatively high capacitance level is present when the gate to source-drain voltage is above the threshold voltage of the transistor, whereas a relatively low capacitance level is present when the gate to source-drain voltage is below the threshold voltage of the transistor. With the source and drain of transistor 30 receiving signal A instead of its gate receiving signal A as in the prior art, the gate to source-drain voltage is negative. In fact, in operation the gate to source-drain voltage of transistor 30 will be near −5 volts. Therefore, it is desirable for transistor 30 to be of the depletion type with a threshold voltage at least several volts below −5 volts, such as the −11 to −13 volt threshold voltage of depletion transistor 30. If an enhancement transistor were used for transistor 30, it would be operating in its relatively low capacitance range because the gate to source-drain voltage would be lower than the threshold voltage. Consequently, using an enhancement transistor would cause substrate 18 to be brought negative at a much lower rate because of the lower capacitance.

Coupling circuit 32 comprises a depletion transistor 34 connected as a capacitor, a polysilicon resistor 36, and an enhancement transistor 38. Transistor 34 has a source and a drain connected together to receive a coupling signal C, and a gate. Resistor 36 is connected between substrate 18 and the gate of transistor 34. Transistor 38 has a gate connected to the gate of transistor 34, a drain connected to substrate 18, and a source connected to node 26. After signal A drives node 26 to a negative voltage, coupling circuit 32 couples node 26 to substrate 18 via transistor 38 without causing a threshold voltage drop between node 26 and substrate 18 in response to signal C which, as shown in FIG. 3, oscillates between $V_{DD}$ and ground.

The gate of transistor 38 is continuously being pulled toward the voltage at substrate 18 by resistor 36. Before node 26 is brought from a negative voltage to essentially ground, signal C at time $t_0$ switches to ground which causes the gate of transistor 38 to be driven below the substrate voltage, ensuring that transistor 38 will be off when node 26 is brought to ground at time $t_1$. During the time from $t_0$ to $t_5$, the gate of transistor 38 is brought near the substrate voltage via resistor 36 at a rate which is a function of the resistance of resistor 36 and the capacitance of transistor 34. These resistance and capacitance values are chosen by conventional RC time constant considerations in relation to the time durations between $t_0$ to $t_5$ and $t_5$ to $t_6$. After time $t_4$ when signal A drives node 26 to a voltage more negative than that of substrate 18, signal C switches to $V_{DD}$ at time $t_5$ which drives the gate of transistor 38 positive with respect to substrate 18. Because node 26 is at a voltage more negative than that of substrate 18 at time $t_5$, transistor 38 will conduct current from substrate 18 to node 26 resulting in only a negligible voltage drop therebetween. The substrate voltage on node 26 substantially sooner than the time duration $t_5$ to $t_6$. At the rate determined by the resistance of resistor 36 and capacitance of transistor 34, the voltage on the gate of transistor 38 will drop toward the substrate voltage. At time $t_6$ signal C is brought to ground causing the voltage on the gate of transistor 38 to be blow the substrate voltage to ensure that transistor 38 does not couple node 26 to substrate 18 when the voltage at node 26 has been driven upward by signal A. Consequently, coupling circuit 32 couples node 26 to substrate 18 for transferring charge therebetween but without the threshold voltage drop of transistor 16 for substrate bias pump 10 of FIG. 1, Coupling circuit 3 is also effective for preventing current flow from node 26 to substrate 18 when signal A is at $V_{DD}$. It should also be noted that if transistor 34 were to have its source and drain connected to the gate of transistor 38 and its gate for receiving signal C, the source and drain would become forward biased at time $t_6$, for example, when signal C switches to ground causing the gate of transistor 38 to be driven to a voltage below that of substrate 18 which would cause high energy electrons to be injected into substrate 18. This is avoided by the connection of transistor 34 as hereinbefore described and as shown in FIG. 2.

It should be noted that enhancement transistors 20, 22, and 38 of FIG. 2 can have a higher threshold voltage, for example 0.6 to 0.8, than the PN junction voltage drop but still avoid forward biasing a PN junction. This is true because transistors 38 and 22 are turned on by signals on their respective gates when they conduct.

An optional transistor 40 having a gate and a drain connected to substrate 18, and a source connected to node 26 may be used for increasing current flow during start-up when a large amount of charge must be transferred from substrate 18 to node 26.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:

1. A substrate bias pump coupled to a substrate for maintaining the substrate at a predetermined voltage comprising:

a first coupling capacitor for coupling an applied voltage to a pump node;

clamping means coupled between the pump node and a reference terminal for clamping the pump node to allow the capacitor to be charged;

a first transistor having a first current electrode coupled to the pump node, a second current electrode connected to the substrate, and a control electrode;

a second coupling capacitor for coupling a control signal to the control electrode of the first transistor; and a resistor coupled between the substrate and the control electrode of the first transistor.

2. The substrate bias pump of claim 1 further including a second transistor having a first current electrode coupled to the pump node, and a second current electrode and a control electrode connected to the substrate.

3. The substrate bias pump of claim 1 wherein the clamping means includes a second and third transistor each having a first current electrode coupled to the pump node and the second transistor having its control electrode coupled to the reference terminal, the second current electrode of the second transistor being coupled to the control electrode of the third transistor, the second current electrode of the third transistor being coupled to the reference terminal, and a capacitor connected to the control electrode of the third transistor for applying a clamping signal thereto.

4. A substrate bias pump for charging a substrate, comprising:

a first coupling capacitor for coupling a pump signal to a pump node;

clamping means coupled between the pump node and a reference terminal for preventing the pump node from exceeding a predetermined voltage when the pump signal is at a first level;

a first transistor having a first current electrode coupled to the pump node, a second current electrode connected to the substrate, and a control electrode;

a second coupling capacitor for coupling a coupling signal to the control electrode of the first transistor; and resistive means for resistively coupling the substrate to the control electrode of the first transistor.

5. The substrate bias pump of claim 4 wherein the second coupling capacitor comprises a second transistor having a control electrode coupled to the control electrode of the first transistor, and first and second current electrodes for receiving the coupling signal.

6. A substrate bias pump for biasing a substrate in response to a pump signal which oscillates between first and second voltage levels, comprising:

a coupling capacitor for coupling the pump signal to a pump node;

clamping means coupled between the pump node and a reference terminal for clamping the voltage on the pump node to a predetermined voltage when the pump signal is at the first voltage level;

coupling means for coupling the substrate to the pump node when the pump signal is at the second voltage level; and feedback means coupled between the substrate and the coupling means for preventing the coupling means from coupling the pump node to the substrate when the pump signal is at the first voltage level.

* * * * *